(12) United States Patent
Li et al.

(10) Patent No.: US 12,035,478 B2
(45) Date of Patent: Jul. 9, 2024

(54) APPARATUS AND METHODS FOR PACKAGING ELECTRONIC COMPONENTS USING A TAPE HAVING DESICCANT ENTRAINED POLYMER ON A REEL

(71) Applicant: CSP TECHNOLOGIES, INC., Auburn, AL (US)

(72) Inventors: Tzu-Li Li, Taiwan (CN); Jonathan R. Freedman, Auburn, AL (US); James S. Hollinger, Auburn, AL (US)

(73) Assignee: CSP Technologies, Inc., Auburn, AL (US)

( * ) Notice: Subject to any disclaimer, the term of this patent is extended or adjusted under 35 U.S.C. 154(b) by 285 days.

(21) Appl. No.: 17/286,739

(22) PCT Filed: Oct. 17, 2019

(86) PCT No.: PCT/US2019/056734
§ 371 (c)(1),
(2) Date: Apr. 19, 2021

(87) PCT Pub. No.: WO2020/081811
PCT Pub. Date: Apr. 23, 2020

(65) Prior Publication Data
US 2021/0378156 A1    Dec. 2, 2021

Related U.S. Application Data

(60) Provisional application No. 62/747,202, filed on Oct. 18, 2018.

(51) Int. Cl.
*B65D 73/02*      (2006.01)
*B29C 48/18*      (2019.01)
(Continued)

(52) U.S. Cl.
CPC ......... *H05K 13/0084* (2013.01); *B29C 48/18* (2019.02); *B65D 73/02* (2013.01);
(Continued)

(58) Field of Classification Search
CPC ...... B65D 51/30; B65D 73/02; B65D 75/323; B65D 75/327; B65D 81/26; B65D 81/264;
(Continued)

(56) References Cited

U.S. PATENT DOCUMENTS 5,132,160 A * 7/1992 Bird .................. H05K 13/0084
                                                      428/218
5,911,937 A    6/1999 Hekal
(Continued)

FOREIGN PATENT DOCUMENTS

EP     0563629 A1    10/1993
JP     06001383 A     1/1994
(Continued)

OTHER PUBLICATIONS

International Search Report issued in PCT/US2019/056734, mailed Feb. 7, 2020.

*Primary Examiner* — Luan K Bui
(74) *Attorney, Agent, or Firm* — David B. Gornish; Eckert Seamans Cherin & Mellott, LLC (57) ABSTRACT

Disclosed is an apparatus. The apparatus includes a reel, a carrier tape wrapped about the reel and a cover tape disposed over the carrier tape. The cover tape and the carrier tape are configured to contain a plurality of electronic components, e.g., integrated circuits. At least one of the carrier tape and the cover tape is made of desiccant entrained polymer, or has desiccant entrained polymer provided on it.

19 Claims, 3 Drawing Sheets

(51) Int. Cl.
    *B65D 81/26*       (2006.01)
    *B65D 85/30*       (2006.01)
    *H01L 21/673*      (2006.01)
    *H05K 13/00*       (2006.01)
    *B29K 483/00*      (2006.01)
    *B29L 31/00*       (2006.01)

(52) U.S. Cl.
    CPC ........... B65D 81/267 (2013.01); B65D 85/30 (2013.01); H01L 21/67333 (2013.01); *B29K 2483/00* (2013.01); *B29L 2031/712* (2013.01); *B65D 2585/86* (2013.01)

(58) Field of Classification Search
    CPC .. B65D 81/267; B65D 85/30; H05K 13/0084; B29K 2483/00
    See application file for complete search history.

(56) References Cited

U.S. PATENT DOCUMENTS

| | | |
|---|---|---|
| 6,080,350 A | 6/2000 | Jekal |
| 6,124,006 A | 9/2000 | Hekal |
| 6,130,263 A * | 10/2000 | Hekal ..................... B29C 45/16 524/550 |
| 6,174,952 B1 | 1/2001 | Hekal et al. |
| 6,214,255 B1 | 4/2001 | Hekal |
| 6,221,446 B1 | 4/2001 | Hekal |
| 7,389,877 B2 | 6/2008 | Dick et al. |
| 7,893,145 B2 | 2/2011 | Inubushi et al. |
| 8,142,603 B2 | 3/2012 | Sagona et al. |
| 2005/0098475 A1 | 5/2005 | Dick et al. |
| 2011/0056951 A1* | 3/2011 | Wooldridge ......... B65D 81/267 220/495.01 |
| 2011/0147262 A1* | 6/2011 | Kudose ................ H05K 3/0097 53/434 |
| 2016/0039955 A1 | 2/2016 | Klein et al. |
| 2020/0016034 A1* | 1/2020 | Voellmicke .......... B65D 75/327 |
| 2021/0309432 A1* | 10/2021 | Voellmicke ............. A61J 1/035 |

FOREIGN PATENT DOCUMENTS

| | | |
|---|---|---|
| JP | 11278540 A | 10/1999 |
| JP | 2003175966 A | 6/2003 |

\* cited by examiner

APPARATUS AND METHODS FOR PACKAGING ELECTRONIC COMPONENTS USING A TAPE HAVING DESICCANT ENTRAINED POLYMER ON A REEL

This application is a U.S. National Phase Application of International Application No. PCT/US2019/056734, entitled "APPARATUS AND METHODS FOR PACKAGING ELECTRONIC COMPONENTS USING A TAPE HAVING DESICCANT ENTRAINED POLYMER ON A REEL," filed Oct. 17, 2019, which claims priority to U.S. Provisional Patent Application No. 62/747,202, entitled "APPARATUS FOR PACKAGING ELECTRONIC COMPONENTS INCLUDING A CARRIER TAPE ENTRAINED WITH A DESICCATING MATERIAL," filed on Oct. 18, 2018, the contents of each are incorporated herein by reference in their entirety.

FIELD

This invention relates to an apparatus for packaging electronic components. In particular, this invention relates to an apparatus for packaging and desiccating integrated circuits contained in or on a carrier tape. Uniquely, the carrier tape and/or the cover tape is made of desiccant entrained polymer, or has desiccant entrained polymer provided thereon.

BACKGROUND

Electronic components, such as integrated circuits ("ICs"), are conventionally shipped from a factory to computer or phone hardware manufacturers in large quantities. To protect these ICs during transportation, they are generally secured in special tubes, trays or to a carrier tape secured to a specialized packing reel. Plastic ICs are susceptible to moisture due to the permeable nature of their plastic composition. It is well known that ICs, when subjected to high levels of moisture, may become inoperable. Mechanical failure of moisture contaminated ICs often leads to the subsequent failure of a device which incorporates the ICs due to thermal and mechanical stress. Accordingly, exposure of ICs to moisture should be limited.

It is also well accepted in industry that ICs can be adversely affected by contamination from volatile organic compounds (VOC) released from some packaging material. To be useful in industry, these ICs must be packaged in environments of extremely low VOC concentration.

It is known that ICs are particularly susceptible to moisture and can also be damaged by static electricity. Further, these components are particularly sensitive to dust. Accordingly, in one process of the prior art, integrated circuits have been packaged for shipping in a carrier tape and packing reel system. The ICs may be baked to release moisture and, once positioned in/on a carrier tape on a reel, stored in moisture-proof bags with a loose desiccant sachet to absorb residual moisture. Alternatively, the reel itself may incorporate a plastic material and desiccating material mixed in, as described in U.S. Pat. No. 7,389,877. That patent describes a desiccant entrained plastic of the reel in which "the desiccating material forms a concentration gradient, and wherein the desiccating material is more highly concentrated in the surface layers than in the interior layer" of the reel.

Prior art processes for packaging ICs are complicated, labor-intensive and time-intensive and the ICs are protected from moisture only after the moisture-proof bag is sealed. Thus, the ICs remain potentially exposed to deleterious moisture during the time between their original baking until the sealing of the bag.

Yet another disadvantage of prior art process is that desiccant sachets packaged together with the packaging reel in the bag are rather bulky and lead to "humps" or other such surface discontinuities on the bags. These bags are thus not advantageously amenable to being stacked onto one other but require an additional packaging component for mechanical stability during storage and transportation. This requirement leads to additional packaging material and labor cost.

In the case of U.S. Pat. No. 7,389,877 as with sachets, the desiccant is not in the direct vicinity of each packaged IC. Therefore, there is a risk that each IC does not receive uniform or adequate desiccation.

Thus, there is a need for improved methods and apparatus for packaging and desiccating ICs.

BRIEF SUMMARY OF THE DISCLOSED CONCEPT

Accordingly, in one aspect, an apparatus for packaging integrated circuits is provided. The apparatus comprises a reel and a carrier tape configured for holding integrated circuits. The carrier tape is wrapped about the reel and has a plurality of cavities. Each cavity is configured to hold and optionally does hold therein an integrated circuit. The apparatus further includes a cover tape disposed over the carrier tape in a manner configured to retain an integrated circuit within each of the cavities and to create an enclosed compartment within each of the cavities. One or both of the carrier tape and the cover tape includes a desiccant entrained polymer, the desiccant entrained polymer being a monolithic composition made from at least a base polymer and a desiccant. Optionally, the desiccant entrained polymer is provided within the enclosed compartment. Optionally, the carrier tape is made from a polymer material that is thermoformed to create the cavities.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

While systems, devices and methods are described herein by way of examples and embodiments, those skilled in the art recognize that the presently disclosed technology is not limited to the embodiments or drawings described. Rather, the presently disclosed technology covers all modifications, equivalents and alternatives falling within the spirit and scope of the appended claims. Features of any one embodiment disclosed herein can be omitted or incorporated into another embodiment.

Any headings used herein are for organizational purposes only and are not meant to limit the scope of the description or the claims. As used herein, the word "may" is used in a permissive sense (i.e., meaning having the potential to) rather than the mandatory sense (i.e., meaning must). Unless specifically set forth herein, the terms "a," "an" and "the" are not limited to one element but instead should be read as meaning "at least one."

This specification discloses apparatus and related methods for packaging electronic components, the apparatus/methods utilizing polymer films or other components entrained with an active agent, i.e., an agent that absorbs, adsorbs or releases a selected material. For example, an active agent may absorb moisture, adsorb volatile organic compounds or release antimicrobial gas. Polymer films or other polymer materials entrained with an active agent, as disclosed herein, may alternatively be referred to as entrained polymer films or entrained polymer materials. As used herein, the term "entrained polymer" is defined as a monolithic material formed of at least a base polymer with an active agent and optionally also a channeling agent entrained or distributed throughout. These types of entrained polymers and methods of making and using the same are disclosed, e.g., in Applicant's U.S. Pat. Nos. 5,911,937, 6,214,255, 6,130,263, 6,080,350, 6,174,952, 6,124,006 and 6,221,446, and U.S. Pat. Pub. No. 2016/0039955, all of which are incorporated by reference herein in their entireties. Optionally, entrained polymer films or tapes made from the same may have a thickness of about 0.05 mm to about 2.5 mm, optionally about 0.2 to about 1.8 mm, optionally 0.2 to 1.3 mm.

The active agent (whether desiccant, oxygen scavenger, a releasing material or ingredient, etc., or combination thereof) is capable of acting on, interacting or reacting with a selected material (e.g., moisture or oxygen). Examples of such actions or interactions may include absorption, adsorption (sorption, generally) or release of the selected material. Entrained polymer films are typically made by extrusion.

The active agents (i) can be immiscible with the base polymer and when mixed and heated with the base polymer and a channeling agent, will not melt, i.e., has a melting point that is higher than the melting point for either the base polymer or the channeling agent, and/or (ii) acts on, interacts or reacts with a selected material. Active agents according to the presently disclosed technology may be in the form of particles such as minerals (e.g., molecular sieve or silica gel, in the case of desiccants), but the presently disclosed technology should not be viewed as limited only to particulate active agents. For example, in some embodiments, an oxygen scavenging formulation may be made from a resin which serves as, or as a component of, the active agent. Such resin may include, for example, one as described in U.S. Pat. No. 7,893,145, which is incorporated by reference herein in its entirety.

As used herein, the term "base polymer" is a polymer optionally having a gas transmission rate of a selected material that is lower than or substantially lower than, that of the channeling agent (where a channeling agent is used in the entrained polymer). By way of example, such a transmission rate would be a water vapor transmission rate in embodiments where the selected material is moisture and the active ingredient is a water absorbing desiccant. In any embodiment (whether or not a channeling agent is included), the primary functions of the base polymer are to provide moldability and structure for the entrained polymer. Suitable base polymers may include thermoplastic polymers, e.g., polyolefins such as polypropylene and polyethylene, polyisoprene, polybutadiene, polybutene, polysiloxane, polycarbonates, polyamides, ethylene-vinyl acetate copolymers, ethylene-methacrylate copolymer, poly(vinyl chloride), polystyrene, polyesters, polyanhydrides, polyacrylianitrile, polysulfones, polyacrylic ester, acrylic, polyurethane and polyacetal, or copolymers or mixtures thereof.

Referring to such a comparison of the base polymer and channeling agent water vapor transmission rate, in any embodiment, the channeling agent has a water vapor transmission rate of at least two times that of the base polymer, optionally at least five times that of the base polymer, optionally at least ten times that of the base polymer, optionally at least twenty times that of the base polymer, optionally at least fifty times that of the base polymer, optionally at least one hundred times that of the base polymer.

As used herein, the term "channeling agent" or "channeling agents" is defined as a material that is immiscible with the base polymer and has an affinity to transport a gas phase substance at a faster rate than the base polymer. Optionally, a channeling agent is capable of forming channels through the entrained polymer when formed by mixing the channeling agent with the base polymer. Optionally, such channels are capable of transmitting a selected material through the entrained polymer at a faster rate than in solely the base polymer. As used herein, the term "channels" or "interconnecting channels" is defined as passages formed of the channeling agent that penetrate through the base polymer and may be interconnected with each other.

As used herein, the term "monolithic," "monolithic structure" or "monolithic composition" is defined as a composition or material that does not consist of two or more discrete macroscopic layers or portions. Accordingly, a "monolithic composition" does not include a multi-layer composite, although it could serve as a layer of such a composite.

As used herein, the term "phase" is defined as a portion or component of a monolithic structure or composition that is uniformly distributed throughout, to give the structure or composition it's monolithic characteristics.

As used herein, the term "selected material" is defined as a material that is acted upon, by, or interacts or reacts with an active agent and is capable of being transmitted through the channels of an entrained polymer (where channeling agent is used). For example, in embodiments in which a desiccant is used as an active agent, the selected material may be moisture or a gas that can be absorbed by the desiccant. In embodiments in which a releasing material is used as an active agent, the selected material may be an agent released by the releasing material, such as moisture, fragrance, or an antimicrobial agent (e.g., chlorine dioxide). In embodiments in which an adsorbing material is used as an active ingredient, the selected material may be certain volatile organic compounds and the adsorbing material may be activated carbon.

In any embodiment, suitable channeling agents may include a polyglycol such as polyethylene glycol (PEG), ethylene-vinyl alcohol (EVOH), polyvinyl alcohol (PVOH), glycerin polyamine, polyurethane and polycarboxylic acid including polyacrylic acid or polymethacrylic acid. Alternatively, the channeling agent can be, for example, a water insoluble polymer, such as a propylene oxide polymerisate-monobutyl ether, such as Polyglykol B01/240, produced by CLARIANT. In other embodiments, the channeling agent could be a propylene oxide polymerisate monobutyl ether, such as Polyglykol B01/20, produced by CLARIANT, propylene oxide polymerisate, such as Polyglykol D01/240, produced by CLARIANT, ethylene vinyl acetate, nylon 6, nylon 66, or any combination of the foregoing.

Optionally, in any embodiment, the active agent may be an oxygen scavenger, e.g., an oxygen scavenging resin formulation.

Optionally, in any embodiment, the active agent may be a VOC adsorbing agent, e.g., activated carbon.

Optionally, in any embodiment, an entrained polymer may include one or more different types of active agents, e.g., a desiccant material and a VOC adsorbing agent.

Suitable active ingredients according to the presently disclosed technology include absorbing materials, such as desiccating compounds. If the active agent is a desiccant, any suitable desiccant for a given application may be used. Typically, physical absorption desiccants are preferred for many applications. These may include molecular sieves, silica gels, clays and starches. Alternatively, the desiccant may be a chemical compound that forms crystals containing water or compounds which react with water to form new compounds.

Figure 1:
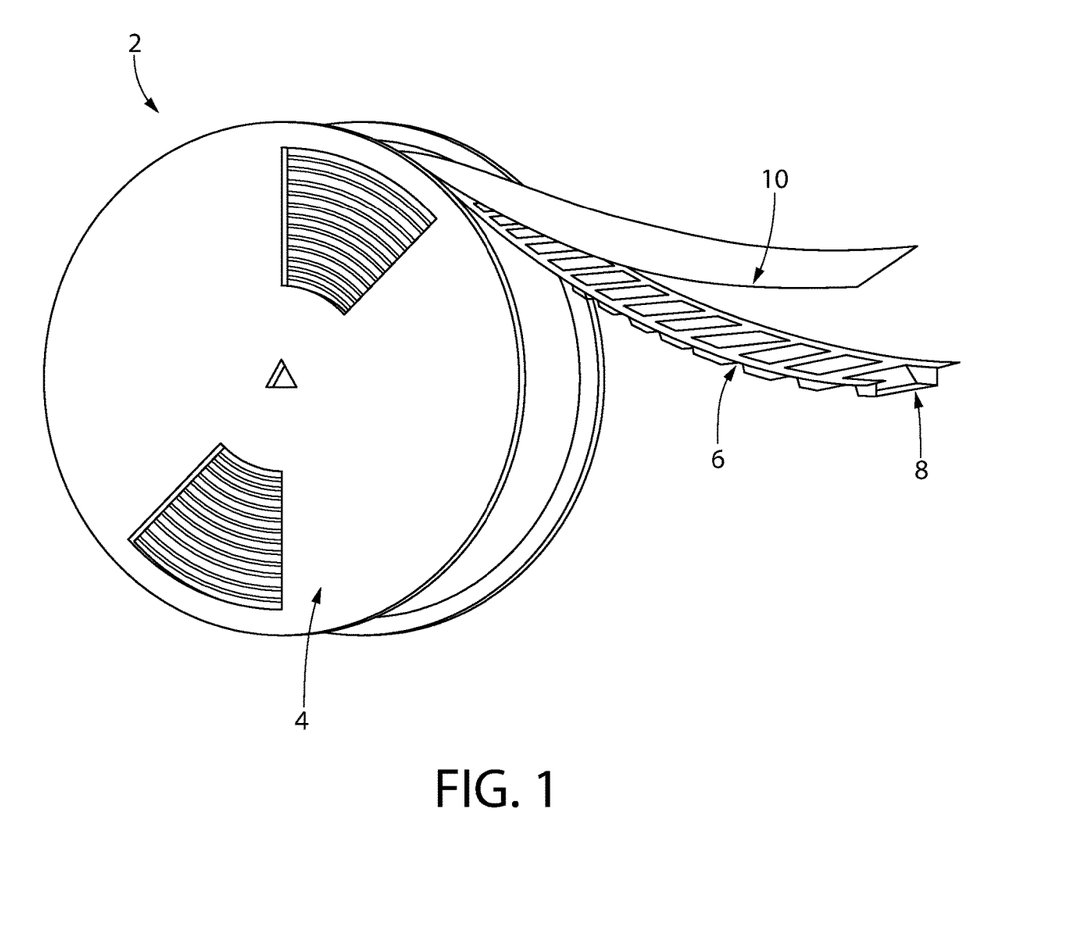
FIG. 1 is an isometric view of an apparatus for packaging electronic components, e.g., integrated circuits.

In one optional aspect, as shown in FIG. 1, the presently disclosed technology is directed to an apparatus 2 for packaging electronic components (e.g., without limitation, integrated circuits), the apparatus 2 including a reel 4 and a carrier tape 6 wrapped about and optionally coupled to the reel 4. The carrier tape 6 preferably includes a plurality of cavities 8 (e.g., without limitation, embossed cavities) for packaging the electronic components, e.g., integrated circuits, in the apparatus 2. Furthermore, the apparatus 2 includes a cover tape 10 disposed over and optionally coupled to (e.g., adhered to) the carrier tape 6 in order to retain the electronic components within the cavities 8. In any embodiment, cover tape 10 and carrier tape 6 thus assembled form an enclosed compartment within each of the cavities 8.

In one embodiment of the disclosed concept, the cover tape 10 is itself made out of desiccant entrained polymer or comprises a desiccant entrained polymer film disposed thereon. In addition or as an alternative, the carrier tape 6 is itself made out of or comprises desiccant entrained polymer material disposed thereon. These embodiments could be implemented where moisture absorption is desired.

The active agent in the cover tape 10 and/or carrier tape 6 (whether, e.g., desiccant, oxygen scavenger, a VOC adsorbing activated carbon, or combination thereof) is capable of acting on, interacting with or reacting with a selected material (e.g., moisture or oxygen). Examples of such actions or interactions may include absorption, adsorption (sorption, generally) or release of the selected material.

Electronic components, such as ICs, can be sensitive to electrostatic charge. Optionally, in any embodiment, the entrained polymer may further include a material which provides electrostatic charge dissipating and/or antistatic properties. An electrostatic charge dissipating and/or antistatic material may optionally include any one or more of the following: carbon products, metal powders, anionic Surfactants, cationic Surfactants, amines, amides, ethoxylated fatty amines, ethoxylated fatty amides and hydrophilic graft copolymers. Optionally, the electrostatic charge dissipating and/or antistatic material is a carbon black. Such materials may be entrained in the entrained polymer or applied to the exterior, e.g., as a spray-coated solution. Alternatively, such materials may be entrained in or applied to the exterior of the carrier tape or cover tape (whether or not in conjunction with an entrained polymer).

In yet another optional aspect of the disclosed concept, the carrier tape 6 itself, in addition to or instead of the cover tape 10, is made of, or includes thereon, a desiccant material. This may be accomplished by way of, for example and without limitation, a thermoforming process to create the cavities 8. It will be appreciated that advantages associated with forming the cover tape 10 out of a desiccant film likewise apply to forming the carrier tape 6 out of a desiccant material. That is, disposing the integrated circuits in close proximity to, and within the same enclosed cavity as the desiccating material (e.g., whether it be the cover tape 10 and/or the carrier tape 6) significantly aides in minimizing the amount of moisture accumulation on or in the ICs over time.

Figure 2:
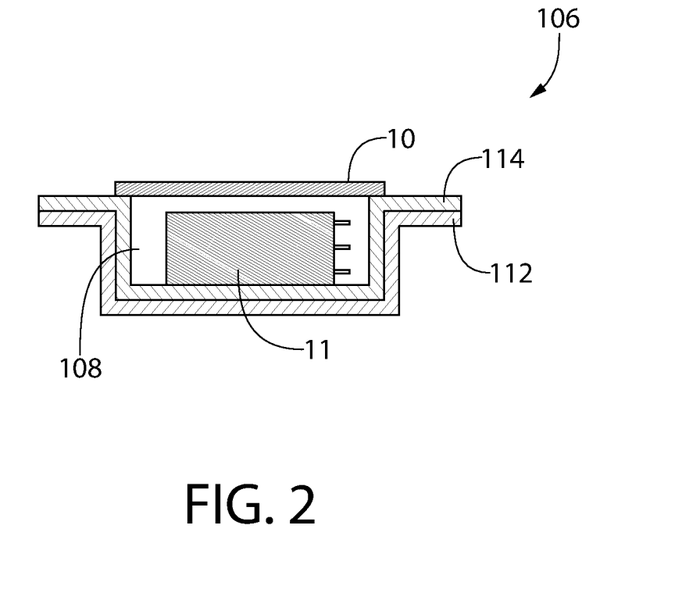
FIG. 2 is a section view of a carrier tape with cover tape and integrated circuit according to an optional first embodiment of the disclosed concept.

FIG. 2 shows a simplified section view of a carrier tape 106, in accordance with another non-limiting aspect of the disclosed concept. As shown in FIG. 2, the carrier tape 106 is formed as a composite component. That is, the carrier tape 106 is formed of two separate materials. For example, the carrier tape 106 may be formed of a base layer 112 made of polypropylene or polyethylene, and a desiccant layer 114. The carrier tape 106 includes a cavity 108 in which an integrated circuit 11 is stored. A cover tape 10 is disposed over the cavity 108 to retain the integrated circuit 11 within the cavity 108. The desiccant layer 114 is preferably a desiccant entrained polymer, as described herein. The base and desiccant layers 112,114 may be coextruded, with the desiccant layer 114 facing the integrated circuits 11 in order to provide the aforementioned moisture absorption advantages. Optionally, the carrier tape 106 is made by coextruding, multilayer thermoforming and/or co-molding processes to have at least two layers including the base layer 112 or outer barrier layer and the desiccant layer 114 or inner layer.

Figure 3:
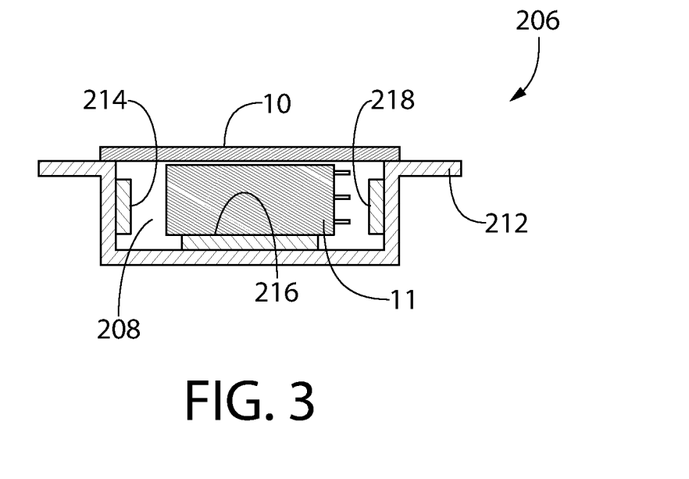
FIG. 3 is a section view of a carrier tape with cover tape and integrated circuit according to an optional second embodiment of the disclosed concept.

FIG. 3 shows a simplified section view of a carrier tape 206, in accordance with another non-limiting aspect of the disclosed concept. The carrier tape 206 includes a cavity 208 in which an integrated circuit 11 is stored. A cover tape 10 is disposed over the cavity 208 to retain the integrated circuit 11 within the cavity 208. As shown in FIG. 3, the carrier tape 206 is optionally formed of a number of different components. Specifically, the carrier tape 206 includes a base layer 212 or outer barrier layer that may be formed of any suitable material known in the art (e.g., without limitation, polyethylene or polypropylene). Furthermore, the carrier tape 206 includes at least one desiccant film, optionally a plurality of desiccant films 214,216,218, adhered to respective surfaces of the cavity 208. It will be appreciated that a carrier tape in accordance with the disclosed concept may have any suitable number, arrangement, and/or configuration of desiccant films similar to the desiccant films 214,216,218 in order to perform the desired function of absorbing moisture near ICs located within cavities of carrier tapes.

Optionally, the films (e.g., 214,216,218) may be heat staked to the respective surfaces of the cavity. The process of heat staking film onto a substrate is described in detail in U.S. Pat. No. 8,142,603, which is incorporated by reference herein in its entirety. Advantageously, heat staking could allow the film to permanently adhere to the sidewall without use of an adhesive. An adhesive may be problematic in some circumstances because it may release unwanted volatiles in and around the apparatus 2. Heat staking, in this instance, refers to heating a sealing layer substrate on the carrier tape (which can include the polymer material of the carrier tape itself) while exerting sufficient pressure on the film and sealing layer substrate to adhere the film to the carrier tape. Preferably, when heat staked, the desiccant film adheres to the carrier tape solely by the heat and pressure applied to the combination and without any additional adhesive materials The size and thickness of the films can vary. In certain embodiments, the film has a thickness of approximately 0.3 mm. Optionally, the film may range from 0.1 mm to 1.8 mm, more preferably from 0.2 mm to 0.6 mm.

Figure 4:
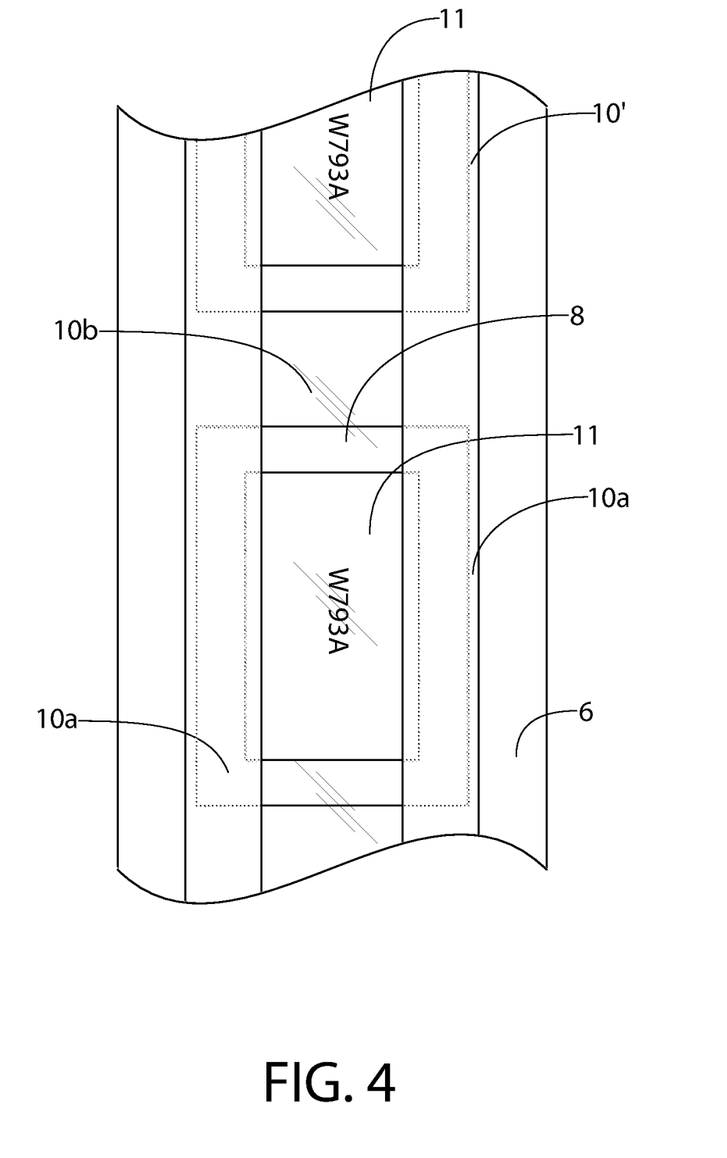
FIG. 4 is a partial top plan view of a carrier tape with cover tape and integrated circuit according to an optional third embodiment of the disclosed concept.

As mentioned above, in some embodiments, the desiccant entrained polymer may be provided on the cover tape. In this respect, FIG. 4 shows a top view of a portion of a carrier tape 6, in accordance with another non-limiting aspect of the disclosed concept. The carrier tape 6 includes a cavities 8, an integrated circuit 11 being stored in each cavity. A cover tape 10' is disposed over the cavities 8 to retain the integrated circuits 11 stored therein. In the illustrated embodiment of FIG. 4, the cover tape includes a desiccant portion 10a and a transparent portion 10b. The desiccant portion 10b is composed of a desiccant entrained polymer, optionally a film that is adhered to the cover tape 10'. The transparent portion 10b enables one to view the stored integrated circuits, including any indicia (e.g., serial numbers) printed thereon.

Optionally, in any embodiment, the entrained polymer film, layer or component includes an amount of active agent that is from 10% to 80%, optionally from 15% to 75%, optionally from 20% to 75%, optionally from 30% to 75%, optionally from 30% to 60%, optionally from 30% to 50%, optionally from 35% to 70%, optionally from 35% to 60%, optionally from 35% to 55%, optionally from 35% to 50%, optionally from 40% to 70%, optionally from 40% to 60%, optionally from 40% to 50%, optionally from 45% to 60%, optionally from 50% to 60%, optionally from 15% to 40%, optionally from 15% to 35%, optionally from 20% to 30%, by weight of the entrained polymer.

Optionally, in any embodiment, the entrained polymer film, layer or component includes an amount of base polymer that may range from 10% to 70%, optionally from 10% to 60%, optionally from 10% to 50%, optionally from 10% to 40%, optionally from 20% to 60%, optionally from 30% to 70%, optionally from 30% to 60%, from 30% to 50%, optionally from 40% to 70%, optionally from 40% to 60%, from 40% to 50%, by weight of the entrained polymer.

Optionally, in any embodiment of entrained polymer that utilizes channeling agent, the entrained polymer film includes an amount of channeling agent that may range from 1% to 16%, optionally from 1% to 14%, optionally from 1% to 12%, optionally from 1% to 10%, optionally from 1% to 8%, optionally from 1% to 6%, optionally from 1% to 5%, optionally from 1% to 4%, preferably from 2% to 16%, optionally from 2% to 14%, optionally from 2% to 12%, optionally from 2% to 10%, optionally from 2% to 8%, optionally from 2% to 6%, optionally from 2% to 5%, optionally from 2% to 4%, optionally from 4% to 12%, optionally from 4% to 10%, optionally from 4% to 8%, optionally from 4% to 6%, optionally from 4% to 5%, optionally from 6% to 12%, optionally from 6% to 10%, optionally from 6% to 8%, optionally from 8% to 12%, optionally from 8% to 10%, by weight of the entrained polymer.

EXEMPLARY EMBODIMENTS

The following exemplary embodiments further describe optional aspects of the invention and are part of this specification. These exemplary embodiments are set forth in a format substantially akin to claims (each with a numerical designation followed by a letter designation), although they are not technically claims of the present application. The following exemplary embodiments refer to each other in dependent relationships as "embodiments" instead of "claims."

1A. An apparatus for packaging integrated circuits, the apparatus comprising a reel and a carrier tape for holding integrated circuits wrapped about and optionally coupled to the reel, the carrier tape comprising a desiccant entrained polymer, the desiccant entrained polymer being a monolithic composition comprising a base polymer and a desiccant.

2A. The apparatus of embodiment 1A, the desiccant entrained polymer being in the form of at least one film adhered to the carrier tape.

3A. The apparatus of embodiment 1A or 2A, the carrier tape comprising a plurality of cavities, each cavity being configured to hold therein an integrated circuit.

4A. The apparatus of embodiment 3A, wherein the desiccant entrained polymer is in the form of a film adhered to a surface of the carrier tape within each cavity.

5A. The apparatus of embodiment 2A or 4A, wherein the film is 0.1-1.8 mm thick, optionally, 0.2-1.5 mm thick, optionally 0.2-1.2 mm thick, optionally 0.2-0.8 mm thick, optionally 0.2-0.6 mm thick.

6A. The apparatus of embodiment 1A or 3A, wherein the carrier tape comprises at least two layers including an outer barrier layer comprising a polymer and an inner layer comprising the desiccant entrained polymer.

7A. The apparatus of embodiment 6A, wherein the inner layer is 0.1-1.8 mm thick, optionally, 0.2-1.5 mm thick, optionally 0.2-1.2 mm thick, optionally 0.2-0.8 mm thick, optionally 0.2-0.6 mm thick.

8A. The apparatus of any one of embodiments 1A-7A, wherein the desiccant is present in the desiccant entrained polymer at from 15% to 35%, optionally from 20% to 30%, by weight of the desiccant entrained polymer.

9A. The apparatus of any one of embodiments 1A-8A, wherein the desiccant is molecular sieve or silica gel.

10A. The apparatus of any one of embodiments 1A-9A, the desiccant entrained polymer comprising a channeling agent that forms channels within the desiccant entrained polymer, the channeling agent optionally selected from one or more of the group consisting of: polyethylene glycol (PEG), ethylene-vinyl alcohol (EVOH), polyvinyl alcohol (PVOH), glycerin polyamine, polyurethane and polycarboxylic acid, propylene oxide polymerisate-monobutyl ether, propylene oxide polymerisate, ethylene vinyl acetate (EVA), nylon 6 and nylon 66.

11A. The apparatus of embodiment 10A, wherein the channeling agent is present in the desiccant entrained polymer at from 1% to 16%, optionally from 1% to 14%, optionally from 1% to 12%, optionally from 1% to 10%, optionally from 1% to 8%, optionally from 1% to 6%, optionally from 1% to 5%, optionally from 1% to 4%, preferably from 2% to 16%, optionally from 2% to 14%, optionally from 2% to 12%, optionally from 2% to 10%, optionally from 2% to 8%, optionally from 2% to 6%, optionally from 2% to 5%, optionally from 2% to 4%, optionally from 4% to 12%, optionally from 4% to 10%, optionally from 4% to 8%, optionally from 4% to 6%, optionally from 4% to 5%, optionally from 6% to 12%, optionally from 6% to 10%, optionally from 6% to 8%, optionally from 8% to 12%, optionally from 8% to 10%, by weight of the entrained polymer.

12A. The apparatus of any one of embodiments 1A-11A, the carrier tape comprising a plurality of cavities, each cavity holding therein an integrated circuit.

13A. The apparatus of embodiment 12A further comprising a cover tape disposed over and optionally coupled to the carrier tape in order to retain the integrated circuits within the cavities.

14A. The apparatus of embodiment 13A, wherein the cover tape is from 0.05 to 1.0 mm thick, optionally 0.1 to 0.5 mm thick.

15A. The apparatus of embodiment 13A or 14A, wherein the cover tape comprises a desiccant entrained polymer.

16A. The apparatus of any one of embodiments 13A-15A, wherein at least a portion of the cover tape in an area disposed over each cavity is transparent.

17A. The apparatus of any one of embodiments 13A-16A, wherein the cover tape includes desiccant entrained polymer coextruded with a polymer tape material.

18A. The apparatus of any one of embodiments 13A-16A, wherein the cover tape includes desiccant entrained polymer in the form of a film adhered to a surface of the polymer tape material, optionally by heat staking without a separate adhesive.

19A. The apparatus of any one of embodiments 13A-18A, wherein the carrier tape and/or cover tape comprises an electrostatic charge dissipating and/or antistatic material, optionally a carbon product.

20A. The apparatus of embodiment 19A, wherein the electrostatic charge dissipating and/or antistatic material is entrained in the desiccant entrained polymer of the carrier tape and/or cover tape.

1B. An apparatus for packaging integrated circuits, the apparatus comprising a reel and a carrier tape for holding integrated circuits wrapped about and optionally coupled to the reel, the carrier tape comprising a plurality of cavities, each cavity holding therein an integrated circuit, the apparatus further comprising a cover tape disposed over and optionally coupled to the carrier tape in order to retain the integrated circuits within the cavities, the cover tape comprising a desiccant entrained polymer, the desiccant entrained polymer being a monolithic composition comprising a base polymer and a desiccant.

2B. The apparatus of embodiment 1B, wherein the desiccant is present in the desiccant entrained polymer at from 15% to 35%, optionally from 20% to 30%, by weight of the desiccant entrained polymer.

3B. The apparatus of embodiment 1B or 2B, wherein the desiccant is molecular sieve or silica gel.

4B. The apparatus of any one of embodiments 1B-3B, the desiccant entrained polymer comprising a channeling agent that forms channels within the desiccant entrained polymer, the channeling agent optionally selected from one or more of the group consisting of: polyethylene glycol (PEG), ethylene-vinyl alcohol (EVOH), polyvinyl alcohol (PVOH), glycerin polyamine, polyurethane and polycarboxylic acid, propylene oxide polymerisate-monobutyl ether, propylene oxide polymerisate, ethylene vinyl acetate (EVA), nylon 6 and nylon 66.

5B. The apparatus of embodiment 4B, wherein the channeling agent is present in the desiccant entrained polymer at from 1% to 16%, optionally from 1% to 14%, optionally from 1% to 12%, optionally from 1% to 10%, optionally from 1% to 8%, optionally from 1% to 6%, optionally from 1% to 5%, optionally from 1% to 4%, preferably from 2% to 16%, optionally from 2% to 14%, optionally from 2% to 12%, optionally from 2% to 10%, optionally from 2% to 8%, optionally from 2% to 6%, optionally from 2% to 5%, optionally from 2% to 4%, optionally from 4% to 12%, optionally from 4% to 10%, optionally from 4% to 8%, optionally from 4% to 6%, optionally from 4% to 5%, optionally from 6% to 12%, optionally from 6% to 10%, optionally from 6% to 8%, optionally from 8% to 12%, optionally from 8% to 10%, by weight of the entrained polymer.

6B. The apparatus of any one of embodiments 1B-5B, wherein the cover tape is from 0.05 to 1.0 mm thick, optionally 0.1 to 0.5 mm thick.

7B. The apparatus of any one of embodiments 1B-6B, wherein at least a portion of the cover tape in an area disposed over each cavity is transparent.

8B. The apparatus of any one of embodiments 1B-7B, wherein the cover tape includes desiccant entrained polymer coextruded with a polymer tape material.

9B. The apparatus of any one of embodiments 1B-7B, wherein the cover tape includes desiccant entrained polymer in the form of a film adhered to a surface of the polymer tape material, optionally by heat staking without a separate adhesive.

10B. The apparatus of any one of embodiments 1B-9B, wherein the carrier tape and/or cover tape comprises an electrostatic charge dissipating and/or antistatic material, optionally a carbon product.

11B. The apparatus of embodiment 10B, wherein the electrostatic charge dissipating and/or antistatic material is entrained in the desiccant entrained polymer of the carrier tape and/or cover tape.

1C. An apparatus comprising:
a reel;
a carrier tape wrapped about the reel; and
a cover tape disposed over the carrier tape, the cover tape and the carrier tape being configured to contain a plurality of electronic components, wherein at least one of the carrier tape and the cover tape is made of desiccant entrained polymer, or has desiccant entrained polymer provided thereon.

2C. The apparatus of embodiment 1C, the carrier tape comprising a plurality of cavities, wherein each of the plurality of cavities is configured to contain an electrical component.

3C. The apparatus of embodiment 1C or 2C, wherein the desiccant entrained polymer comprises a base polymer, a channeling agent and a desiccant.

4C. The apparatus of embodiment 3C, wherein the desiccant entrained polymer further comprises an electrostatic charge dissipating and/or antistatic material.

5C. The apparatus of embodiment 4C, wherein the electrostatic charge dissipating and/or antistatic material is a carbon product.

6C. The apparatus of any of embodiments 1C-5C, wherein the desiccant in the desiccant entrained polymer is silica gel or molecular sieve and is present in an amount of 15% to 40%, optionally 20% to 30% by weight with respect to the total weight of the entrained polymer.

7C. The apparatus of any of embodiments 1C-6C, wherein the desiccant entrained polymer comprises a channeling agent present in an amount of 2% to 12% by weight with respect to the total weight of the entrained polymer.

8C. The apparatus of any of embodiments 1C-7C, wherein the desiccant entrained polymer is coextruded with a substrate to form the cover tape.

9C. The apparatus of any of embodiments 1C-7C, wherein desiccant entrained polymer film is heat staked to the carrier tape.

10C. The apparatus of any of embodiments 2C-9C, comprising an electronic component, optionally an integrated circuit, disposed in each of the plurality of cavities.

1D. A process for making the apparatus of any one of embodiments 1A-20A, 1B-11B or 1C-1D, the process comprising extruding, thermoforming and/or molding carrier tape to include desiccant entrained polymer and assembling the carrier tape, integrated circuits, cover tape and reel to form the apparatus.

2D. The process of embodiment 1D, wherein the step of extruding, thermoforming and/or molding carrier tape comprises coextruding, multilayer thermoforming and/or co-molding the carrier tape to have at least two layers including an outer barrier layer comprising a polymer and an inner layer comprising the desiccant entrained polymer.

1E. A process for making the apparatus of any one of embodiments 1A-20A, 1B-11B or 1C-1D, the process comprising providing carrier tape and adhering desiccant entrained polymer film onto a surface of the carrier tape, optionally by heat staking.

1F. A process for making the apparatus of any one of embodiments 1A-20A, 1B-11B or 1C-1D, the process comprising providing carrier tape and extruding, thermoforming and/or molding a cover tape to include desiccant entrained polymer and assembling the carrier tape, integrated circuits, cover tape and reel to form the apparatus.

1G. The process of any one of embodiments 1D, 2D, 1E and 1F, further comprising placing and sealing the apparatus within a moisture-proof barrier bag.

Optionally, in any of the above-noted exemplary embodiments, the desiccant entrained polymer may more generically be an active agent entrained polymer, as the term "active agent" is defined herein. Also, optionally, in any of the above-noted exemplary embodiments, the integrated circuit may more generically be an electrical component.

While the presently disclosed technology has been described in detail and with reference to specific examples thereof, it will be apparent to one skilled in the art that various changes and modifications can be made therein without departing from the spirit and scope thereof. It is understood, therefore, that the presently disclosed technology is not limited to the particular embodiments disclosed, but it is intended to cover modifications within the spirit and scope of the present presently disclosed technology as defined by the appended claims.

What is claimed is:

1. An apparatus for packaging integrated circuits, the apparatus comprising a reel and a carrier tape configured for holding integrated circuits, the carrier tape being wrapped about the reel, the carrier tape comprising a plurality of cavities, each cavity configured to hold therein an integrated circuit, the apparatus further comprising a cover tape disposed over the carrier tape in a manner configured to retain an integrated circuit within each of the cavities and to create an enclosed compartment within each of the cavities, wherein the carrier tape comprises a desiccant entrained polymer, the desiccant entrained polymer being a monolithic composition comprising a base polymer a desiccant and a polymeric channeling agent having a water vapor transmission rate greater than the base polymer, the monolithic composition comprising channels formed of the channeling agent, the desiccant being molecular sieve, the desiccant being present in the desiccant entrained polymer from 15% to 70% by weight of the desiccant entrained polymer.

2. The apparatus of claim 1, further comprising an integrated circuit held in each cavity.

3. The apparatus of claim 1, wherein the desiccant entrained polymer is provided as a film adhered to a surface of the carrier tape.

4. The apparatus of claim 3, wherein the film is provided within the enclosed compartment.

5. The apparatus of claim 1, wherein the carrier tape comprises at least two layers including an outer barrier layer comprising a polymer and an inner layer comprising the desiccant entrained polymer.

6. The apparatus of claim 1, wherein at least a portion of the cover tape in an area disposed over each cavity is transparent so as to facilitate viewing of indicia printed on a product stored within each cavity.

7. The apparatus of claim 1, wherein the desiccant entrained polymer is provided as a film adhered to a surface of the carrier tape and/or the cover tape, and the molecular sieve is present in the desiccant entrained polymer from 15% to 50% by weight of the desiccant entrained polymer.

8. A process for making the apparatus of claim 1, the process comprising extruding, thermoforming and/or molding the carrier tape to include the desiccant entrained polymer and assembling the carrier tape, cover tape and reel to form the apparatus.

9. The process of claim 8, further comprising disposing an integrated circuit within each cavity.

10. The process of claim 9, wherein the step of extruding, thermoforming and/or molding carrier tape comprises coextruding, multilayer thermoforming and/or co-molding the carrier tape to have at least two layers including an outer barrier layer comprising a polymer and an inner layer comprising the desiccant entrained polymer.

11. A process for making the apparatus of claim 6, the process comprising providing carrier tape and extruding, thermoforming and/or molding a cover tape to include desiccant entrained polymer and assembling the carrier tape, cover tape and reel to form the apparatus.

12. A process for making the apparatus claim 6, the process comprising adhering desiccant entrained polymer film onto a surface of the carrier tape and/or cover tape by heat staking and assembling the carrier tape, cover tape and reel to form the apparatus.

13. The process of claim 12, further comprising disposing an integrated circuit within each cavity.

14. An apparatus for packaging integrated circuits, the apparatus comprising a reel and a carrier tape configured for holding integrated circuits, the carrier tape being wrapped about the reel, the carrier tape comprising a plurality of cavities, each cavity configured to hold therein an integrated circuit, the apparatus further comprising a cover tape disposed over the carrier tape in a manner configured to retain an integrated circuit within each of the cavities and to create an enclosed compartment within each of the cavities, wherein one or both of the carrier tape and the cover tape comprises a desiccant entrained polymer, the desiccant entrained polymer being a monolithic composition comprising a base polymer, a desiccant and a polymeric channeling agent having a water vapor transmission rate greater than the base polymer, the monolithic composition comprising channels formed of the channeling agent, the desiccant being molecular sieve, the desiccant being present in the desiccant entrained polymer from 15% to 70% by weight of the desiccant entrained polymer, wherein the desiccant entrained polymer is provided within the enclosed compartment and an integrated circuit is held in each cavity.

15. The apparatus of claim 14, wherein the desiccant is molecular sieve, which is present in the desiccant entrained polymer from 15% to 50% by weight of the desiccant entrained polymer.

16. The apparatus of claim 15, wherein the desiccant entrained polymer is provided as a film adhered to a surface of: the carrier tape and/or the cover tape.

17. The apparatus of claim 15, wherein the desiccant entrained polymer is a layer of the carrier tape and/or the cover tape.

18. The apparatus of claim 15, wherein the carrier tape and/or the cover tape is made from the desiccant entrained polymer.

19. The apparatus of claim 15, wherein at least a portion of the cover tape in an area disposed over each cavity is transparent so as to facilitate viewing of indicia printed on a product stored within each cavity.

\* \* \* \* \*

UNITED STATES PATENT AND TRADEMARK OFFICE
CERTIFICATE OF CORRECTION

PATENT NO. : 12,035,478 B2
APPLICATION NO. : 17/286739
DATED : July 9, 2024
INVENTOR(S) : Tzu-Li Li, Jonathan R. Freedman and James S. Hollinger Page 1 of 1

It is certified that error appears in the above-identified patent and that said Letters Patent is hereby corrected as shown below:

In the Claims

Column 12, Claim 15, Lines 64-67, replace "wherein the desiccant is molecular sieve, which is present in the desiccant entrained polymer from 15% to 50% by weight of the desiccant entrained polymer." with --wherein the desiccant is present in the desiccant entrained polymer from 15% to 50% by weight of the desiccant entrained polymer.--

Signed and Sealed this
Third Day of September, 2024

Katherine Kelly Vidal
*Director of the United States Patent and Trademark Office*